(12) United States Patent
Wu et al.

(10) Patent No.: US 9,291,909 B2
(45) Date of Patent: Mar. 22, 2016

(54) COMPOSITION COMPRISING A POLYMERIC THERMAL ACID GENERATOR AND PROCESSES THEREOF

(71) Applicants: Hengpeng Wu, Hillsborough, NJ (US); SungEun Hong, Basking Ridge, NJ (US); Yi Cao, Clinton, NJ (US); Jian Yin, Bridgewater, NJ (US); Margareta Paunescu, Clinton, NJ (US); Muthiah Thiyagarajan, Bridgewater, NJ (US)

(72) Inventors: Hengpeng Wu, Hillsborough, NJ (US); SungEun Hong, Basking Ridge, NJ (US); Yi Cao, Clinton, NJ (US); Jian Yin, Bridgewater, NJ (US); Margareta Paunescu, Clinton, NJ (US); Muthiah Thiyagarajan, Bridgewater, NJ (US)

(73) Assignee: AZ ELECTRONIC MATERIALS (LUXEMBOURG) S.A.R.L., Luxembourg (LU)

(*) Notice: Subject to any disclaimer, the term of this patent is extended or adjusted under 35 U.S.C. 154(b) by 50 days.

(21) Appl. No.: 13/896,936

(22) Filed: May 17, 2013

(65) Prior Publication Data

US 2014/0342290 A1  Nov. 20, 2014

(51) Int. Cl.

| | |
|---|---|
| G03F 7/20 | (2006.01) |
| C08F 220/34 | (2006.01) |
| G03F 7/40 | (2006.01) |
| C08F 226/10 | (2006.01) |
| C08F 8/44 | (2006.01) |
| C09D 133/14 | (2006.01) |
| C09D 139/06 | (2006.01) |
| G03F 7/00 | (2006.01) |
| H01L 21/027 | (2006.01) |
| G03F 7/004 | (2006.01) |
| G03F 7/039 | (2006.01) |

(52) U.S. Cl.
CPC . *G03F 7/405* (2013.01); *C08F 8/44* (2013.01); *C08F 220/34* (2013.01); *C08F 226/10* (2013.01); *C09D 133/14* (2013.01); *C09D 139/06* (2013.01); *G03F 7/0035* (2013.01); *G03F 7/40* (2013.01); *H01L 21/0273* (2013.01); *C08L 2201/54* (2013.01); *G03F 7/0048* (2013.01); *G03F 7/0392* (2013.01)

(58) Field of Classification Search
CPC ......... C08F 220/34; G03F 7/004; G03F 7/09; G03F 7/092; G03F 7/094; G03F 7/095; G03F 7/11; G03F 7/20; G03F 7/30
USPC ............. 430/15, 271.1, 273.1, 312, 330, 331; 526/310
See application file for complete search history.

(56) References Cited

U.S. PATENT DOCUMENTS

| | | | | |
|---|---|---|---|---|
| 2,839,401 | A | * | 6/1958 | Webers et al. ................. 430/627 |
| 4,491,628 | A | | 1/1985 | Ito et al. |
| 5,321,110 | A | * | 6/1994 | Shih .............................. 526/264 |
| 5,350,660 | A | | 9/1994 | Urano et al. |
| 5,843,624 | A | | 12/1998 | Houlihan et al. |
| 5,858,620 | A | | 1/1999 | Ishibashi et al. |
| 5,863,707 | A | | 1/1999 | Lin |
| 6,130,303 | A | * | 10/2000 | Neff et al. ...................... 526/306 |
| 6,207,778 | B1 | * | 3/2001 | Jachowicz et al. ............. 526/258 |
| 6,790,587 | B1 | | 9/2004 | Feiring et al. |
| 6,818,258 | B2 | | 11/2004 | Kaneko et al. |
| 6,849,377 | B2 | | 2/2005 | Feiring et al. |
| 6,866,984 | B2 | | 3/2005 | Baik et al. |
| 6,916,590 | B2 | | 7/2005 | Kaneko et al. |
| 6,916,594 | B2 | | 7/2005 | Bok et al. |
| 7,745,077 | B2 | | 6/2010 | Thiyagarajan et al. |
| 7,923,200 | B2 | | 4/2011 | Thiyagarajan et al. |
| 8,226,838 | B2 | | 7/2012 | Cheng et al. |
| 8,309,278 | B2 | | 11/2012 | Yang et al. |
| 2013/0078576 | A1 | | 3/2013 | Wu et al. |

FOREIGN PATENT DOCUMENTS

| | | | |
|---|---|---|---|
| JP | 58-049410 | * | 3/1983 |
| WO | WO 2007/141199 A2 | | 12/2007 |

OTHER PUBLICATIONS

Machine translation of the abstract of JP 58-049410, published on Mar. 23, 1983.*
English translation of JP 58-049410 published on Mar. 23, 1983.*
Form PCT/ISA/220, Form PCT/ISA/210, and Form PCT/ISA/237 for for PCT/EP2014/059999 dated Oct. 14, 2014, which corresponds to U.S. Appl. No. 13/896,936.

* cited by examiner

Primary Examiner — Anca Eoff
(74) *Attorney, Agent, or Firm* — Mitchell Brustein

(57) ABSTRACT

The present invention relates a novel aqueous composition comprising polymeric thermal acid generator and a process of coating the novel composition onto photoresist pattern, thereby forming a layer of the polymeric thermal acid generator over the photoresist pattern. The polymeric thermal acid generator comprises a polymer having at least one repeating unit of structure 2;

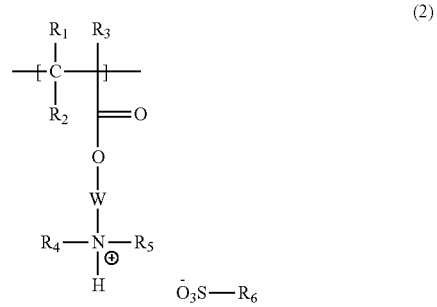

where $R_1$ to $R_5$ are independently chosen from the group consisting of H and $C_1$-$C_6$ alkyl; $R_6$ is chosen from the group consisting of unsubstituted aryl, substituted aryl, alkyl ($C_1$-$C_8$) and fluoroalkyl ($C_1$-$C_8$) and W is a $C_2$-$C_6$ alkylene spacer.

17 Claims, 1 Drawing Sheet

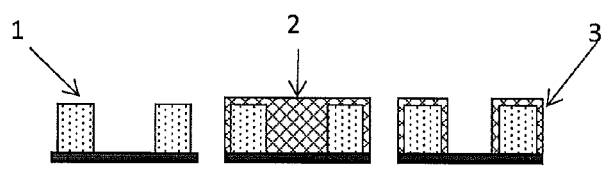
Figure 1: Formation of capped layer of thermal acid generator
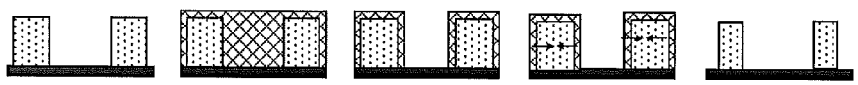
Figure 2: Formation of capped layer of thermal acid generator
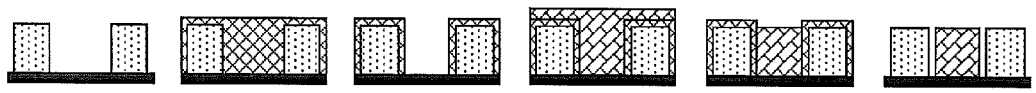
Figure 3: Formation of double patterned features
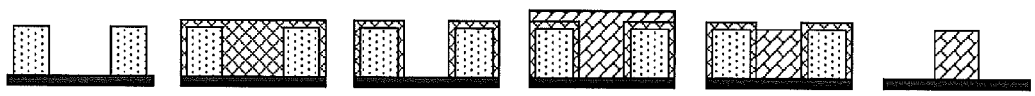
Figure 4: Formation of Lithographic Image Reversal

COMPOSITION COMPRISING A POLYMERIC THERMAL ACID GENERATOR AND PROCESSES THEREOF The present invention relates a novel aqueous composition comprising polymeric thermal acid generator and a process for coating the novel composition onto a photoresist pattern, especially a positive chemically amplified resist developable in aqueous base, thereby forming a layer of the polymeric thermal acid generator over the photoresist pattern. The invention also relates to process for forming very fine patterns.

The densification of integrated circuits in semiconductor technology has been accompanied by a need to manufacture very fine interconnections within these integrated circuits. Ultra-fine patterns are typically created by forming patterns in a photoresist coating using photolithographic techniques.

Miniaturization of integrated circuits requires the printing of narrower and narrower dimensions within the photoresist. Various technologies have been developed to shrink the dimensions to be printed by the photoresist, examples of such technologies are, multilevel coatings, antireflective coatings, phase-shift masks, photoresists which are sensitive at shorter and shorter wavelengths, etc.

A particular process for printing smaller dimensions relies on the technique of forming a thin layer of a polymer on top of the photoresist pattern, thus widening the photoresist pattern and reducing the dimension of the space between adjacent photoresist features. This narrowed space can be used to etch and define the substrate or be used to deposit materials, such as metals. This bilevel technique allows much smaller dimensions to be defined as part of the manufacturing process for microelectronic devices, without the necessity of reformulating new photoresist chemistries. The top coating layer or shrink material may be an inorganic layer such as a dielectric material, or it may be organic such as a crosslinkable polymeric material.

Dielectric shrink materials are described in U.S. Pat. No. 5,863,707, and comprise silicon oxide, silicon nitride, silicon oxynitride, spin on material or chemical vapor deposited material. Organic polymeric coatings are described in U.S. Pat. No. 5,858,620, where such coatings undergo a crosslinking reaction in the presence of an acid, thereby adhering to the photoresist surface, but are removed where the top shrink coating has not been crosslinked. U.S. Pat. No. 5,858,620 discloses a method of manufacturing a semiconductor device, where the substrate has a patterned photoresist which is coated with a top layer, the photoresist is then exposed to light and heated so that the photogenerated acid in the photoresist diffuses through the top layer and can then crosslink the top layer. The extent to which the acid diffuses through the top coat determines the thickness of the crosslinked layer. The portion of the top layer that is not crosslinked is removed using a solution that can dissolve the polymer. Furthermore, U.S. Pat. No. 7,745,007 discloses an aqueous shrink coating composition comprising a water soluble polymer containing at least one alkylamino group which is used in a process for manufacturing a microelectronic device.

Photoresist patterns useful for this invention are ones originating from positive chemically amplified resists compositions exposed through conventional lithography techniques, such as UV lithography (450 nm to 10 nm), immersion lithography, EUV or e-beam. One such photoresist coating composition comprises a polymer containing acid labile groups which block base soluble groups and a photoacid generator (PAG). Examples of base soluble groups which can be bound to positive chemically amplified photoresist resin and blocked with acid labile groups are carboxylic acid moieties (—C═O—OH), phenolic moieties (e.g as in novolak resins and hydroxystyrene copolymers), fluorinated alcohol moieties such as —C(C(R$_f$)$_3$)$_2$OH where R$_f$ is a C$_1$-C$_4$ fluoroalkyl group.

Photoresist compositions are used in microlithography processes for making miniaturized electronic components such as in the fabrication of computer chips and integrated circuits. Generally, in these processes, a film of a photoresist composition is first applied to a substrate material, such as silicon wafers used for making integrated circuits. The coated substrate is then baked to evaporate any solvent in the photoresist composition and to fix the coating onto the substrate. The coated and baked surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. The photoresist may be positive or negative working.

Directed self assembly of block copolymers is a useful method for generating smaller and smaller patterned features for the manufacture of microelectronic devices in which the critical dimensions (CD) of features on the order of nanoscale can be achieved. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high density patterns. The block copolymer for use in directed self assembly in conjunction with the novel neutral layer composition can be any block copolymers which can form domains through self assembly.

The present invention relates to a novel composition comprising a polymeric thermal acid generator and also relates to novel processes for defining fine patterns using such compositions.

BRIEF DESCRIPTION OF THE DRAWING

FIG. 1 shows capping of photoresist features using polymeric thermal acid generator FIG. 2 shows trimming of photoresist features using polymeric thermal acid generator FIG. 3 shows double patterning process using polymeric thermal acid generator FIG. 4 shows lithographic image reversal of original photoresist features by using polymeric thermal acid generator

SUMMARY OF THE INVENTION

The present invention relates a novel aqueous composition comprising polymeric thermal acid generator and processes where a coating of the novel composition is formed onto a photoresist pattern thereby forming a layer of the polymeric thermal acid generator over the photoresist pattern.

The polymeric thermal acid generator comprises a polymer having at least one repeating unit of structure 2;

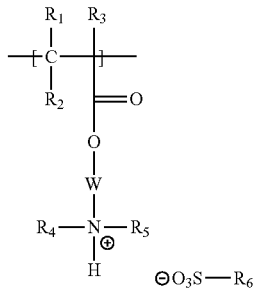

(2)

where $R_1$ to $R_5$ are independently chosen from the group consisting of H and $C_1$-$C_6$ alkyl; $R_6$ is chosen from the group consisting of unsubstituted aryl, substituted aryl, alkyl ($C_1$-$C_8$) and fluoroalkyl ($C_1$-$C_8$) and W is a $C_2$-$C_6$ alkylene spacer. In one embodiment W is methylene or ethylene.

DETAILED DESCRIPTION OF THE INVENTION

The invention relates to a novel aqueous composition comprising a polymeric thermal acid generator and also relates to novel processes for defining fine patterns. The invention relates to a process for coating the novel composition onto a photoresist pattern, such as a positive chemically amplified photoresist developable in aqueous base, and thereby forming after post applied bake and aqueous development, a layer of the polymeric thermal acid generator over the photoresist pattern. The coated patterns may be used in further processing to form patterns.

The polymeric thermal acid generator is reaction product of a polymeric amine with a sulfonic acid. The polymeric amine comprises at least one unit of structure (1),

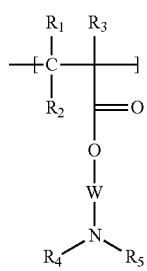

(1)

where $R_1$ to $R_5$ are independently chosen from the group consisting of H and $C_1$-$C_6$ alkyl. The polymeric thermal acid generator is dissolved in water to form an aqueous solution. The polymeric thermal acid generator may comprise a polymer having at least one repeating unit of structure 2;

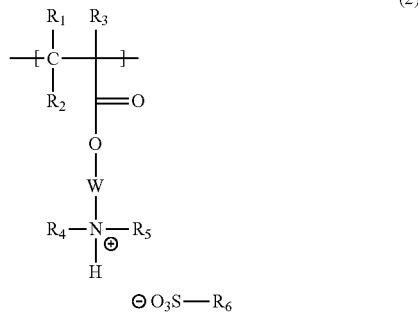

(2)

where $R_1$ to $R_5$ are independently chosen from the group consisting of H and $C_1$-$C_6$ alkyl; $R_6$ is chosen from the group consisting of unsubstituted aryl, substituted aryl, alkyl ($C_1$-$C_8$) and fluoroalkyl ($C_1$-$C_8$) and W is a $C_2$-$C_6$ alkylene spacer. In one embodiment, W is methylene or ethylene.

The novel polymeric thermal acid generator may further comprise at least one monomeric unit of structure 3,

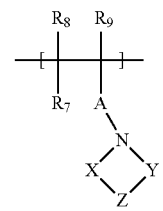

(3)

where, $R_7$ to $R_9$ are independently selected from hydrogen and $C_1$ to $C_6$ alkyl, A is selected from a group consisting of single bond, O, C(O), (C=O)O and $C_1$ to $C_4$ alkyl; X, Y, Z and N form a cyclic structure, further where X is selected from $C_1$ to $C_6$ alkylene, unsaturated $C_1$ to $C_6$ alkylene, direct bond and mixtures thereof, Y is selected from $C_1$ to $C_6$ alkylene, unsaturated $C_1$ to $C_6$ alkylene, direct bond and mixtures thereof, Z is selected from O, C(O) and N, and N is nitrogen.

More specific examples of the monomeric unit of structure (3) may be,

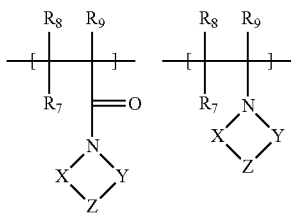

where, $R_7$ to $R_9$ are independently selected from hydrogen and $C_1$ to $C_6$ alkyl, A is selected from a single bond, O, C(O), (C=O)O and $C_1$ to $C_4$ alkyl; X, Y, Z and N form a cyclic structure, further where, X is selected from $C_1$ to $C_6$ alkylene, unsaturated $C_1$ to $C_6$ alkylene, direct bond and mixtures thereof, Y is selected from $C_1$ to $C_6$ alkylene, unsaturated $C_1$ to $C_6$ alkylene, direct bond and mixtures thereof, Z is selected from O, C(O), and N, and N is nitrogen. Even more specifically, the monomeric unit of structure (3) may be selected from,

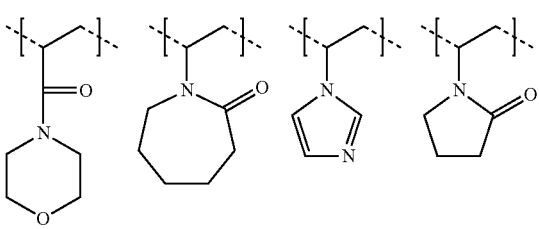

The novel polymeric thermal acid generator may be dissolved in solvent comprising water or water and a water miscible solvent. Non limiting examples of suitable water miscible solvents are as follows: ($C_1$-$C_8$)alcohols, diols, triols, ketones, esters, lactates, amides, ethylene glycol monoalkyl ethers, ethylene glycol monoalkyl ether acetate, N-methyl pyrrolidone, propylene glycol monomethyl ether, propylene glycol monoethyl ether, propylene glycol monoethyl ether acetate, and propylene glycol monoethyl ether acetate. The novel composition may additionally comprise additives such as surfactant, $C_1$-$C_8$ alcohol or crosslinking compound. The solid content of the polymeric thermal acid generator may range from 0.5 to 20 weight %. In one embodiment the novel composition is free of a crosslinking agent. The novel composition may further comprise additives, such as surfactants, crosslinking compounds, etc.

The novel polymeric thermal acid generator may be prepared by isolating the novel polymer in the dry form rather than by providing an admixture of an aqueous solution of a polymer comprising the unit 1 containing the free amino group with sulfonic acid, that is without isolating the polymer. After adding the sulfonic acid to the polymer containing the repeat unit (1) dissolved in an organic solvent such as acetonitrile, the polymer may be isolated by precipitation into organic solvents such as diethyl ether. The starting copolymer containing the amino repeat unit (1) and its copolymers can be made by conventional radical polymerization in acetonitrile (isopropylalcohol (IPA), 2-butanone and methanol can also be used instead of acetonitrile) using a radical initiator such as AIBN with the alkene monomers from which repeat unit of type (1) and type (3) are derived.

Typically, such polymerization are run at a temperature of 60 to 90° C., depending on the initiator type. Isolation of the intermediate polymer containing repeat units of type (1) is accomplished by precipitation into solvents like diethyl ether, isolation of the intermediate gum, dissolution into methanol and precipitation again into ether.

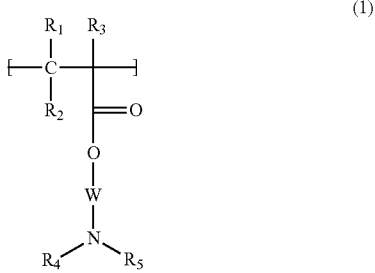

(1)

The molecular weight of the novel polymer may be in the range of 5,000 to 200,000 g/mol.

The novel polymeric thermal acid generator composition may be coated onto a photoresist pattern such as a positive chemically amplified photoresist developable in aqueous base, post applied baked (PAB) at 100° C. to 180° C., and subsequently developed to remove unreacted polymeric thermal acid generator with an aqueous removing solution, thereby forming a coating layer over the photoresist pattern. During PAB, the polymeric acid generator is activated, diffuses and deprotects the photoresist. The deprotected depth in the photoresist layer is controlled by PAB. The aqueous removal solution may comprise water or water mixed with a water soluble solvent chosen from the group consisting of: ($C_1$-$C_8$) alcohols, diols, triols, ketones, esters, lactates, amides, ethylene glycol monoalkyl ethers, ethylene glycol monoalkyl ether acetate, N-methyl pyrrolidone, propylene glycol monomethyl ether, propylene glycol monoethyl ether, propylene glycol monomethyl ether acetate, and propylene glycol monoethyl ether acetate. Additionally, aqueous removal solutions may further comprise additives selected from surfactant, $C_1$-$C_8$ alcohol.

FIG. 1 shows the scheme for the formation of the coating comprising the novel polymer. In FIG. 1, (1) refers to the photoresist pattern, (2) refers to the novel composition covering the pattern and (3) is the novel coated layer.

In one embodiment for using the novel composition, a process is employed which can lead to trimming of the original photoresist pattern (FIG. 2). The invention when employed in a trimming process can be employed with a first photoresist pattern, where the photoresist may be a positive chemically amplified photoresist imaged by conventional lithographic techniques, such as UV lithography (450 nm to 10 nm), immersion lithography, EUV or e-beam. First, a photoresist pattern is generated using a conventional lithographic technique such as photolithography with a photoresist comprising a polymer with acid labile groups which protect the base soluble moieties of the polymer, and a photoacid generator. Then, the novel polymeric thermal acid generator composition is coated over the photoresist pattern, and the coated pattern is subjected to a PAB to activate the novel thermal acid generator. This activated acid generator then diffuses into, and deprotects a thin layer of the underlying photoresist pattern. After the pattern is developed with an aqueous alkali developer, such as tetramethylammonium hydroxide (TMAH), a pattern with a smaller dimension is obtained. This trimming process is especially suitable for line and space (L/S) feature types defined in a positive chemically amplified resist.

The novel composition may also be used for a double patterning process as shown in FIG. 3. The invention when employed in a double patterning process, such as is shown in FIG. 3, leads to further improvement in resolution or CD uniformity of targeted features made by conventional lithographic techniques, such as UV lithography (450 nm to 10 nm), immersion lithography, EUV or e-beam.

In this double patterning process, a first photoresist pattern, such as a chemically amplified photoresist, is generated using a conventional lithographic technique such as photolithography. Then the novel polymeric thermal acid generator composition is coated over the photoresist pattern, which is them subjected to a PAB. The PAB activates the novel thermal acid generator which diffuses into and deprotects a thin layer of the underlying photoresist patterns. After the pattern is developed with water leaving a coating over the pattern, a second coating composition comprising a polymer containing acid labile groups protecting aqueous base soluble groups is carefully over-coated and processed such that only trenches in the original patterns are filled without covering the top of the photoresist pattern. This second coating comprises a suitable spin casting solvent(s) which does not dissolve the first photoresist pattern. Suitable spin casting solvent may be chosen from the group consisting of $C_4$-$C_8$ alkyl acetate, $C_8$-$C_{12}$ alkanes, $C_4$-$C_8$ alcohols, and mixtures of these which are miscible. A subsequent PAB creates an interface between the coated photoresist pattern and the second coating in which a thin layer of the second coating material is deprotected by diffused thermal acid generator from the surface of the first photoresist patterns. This deprotected material from both the first photoresist pattern and the second coating at the interface between the two is then removed using an aqueous base developer resulting in double patterning (FIG. 3). If the second coating covers the top of the original lines, a dry etch back can be applied, or chemical mechanical polishing can be employed to remove this layer. Optionally, this layer covering the top of the original lines can be removed by using a wet etch which can be realized by just over-coating another layer of the above polymeric thermal acid generator aqueous composition, baking and developing away the layer covering the top of the original lines which has reacted with the activated polymeric thermal acid generator during the PAB.

As a variant of the above-mentioned double patterning, the second coating composition may be replaced by a polymer bearing no acid labile groups and insoluble in aqueous base. Provided that the second coating composition polymer is soluble in a spin casting solvent that does not dissolve the first photoresist pattern as described above. In this case, double patterning is realized by just removing the deprotected thin layer from the first photoresist pattern surface.

As a further variant of the above-mentioned double patterning process, the second coating composition may be replaced by a polymer that has a controlled dissolution rate in with an aqueous alkali developer, such as tetramethylammonium hydroxide (TMAH). Such an approach allows an easier removal of the second coating composition material covering the pattern and eliminating the need for plasma or chemical mechanical polishing to accomplish this step. Again this second coating solvent must be dissolved in a solvent which does not destroy the capped photoresist pattern as described above. In this case, double patterning is realized by removing both deprotected thin layer around the first photoresist patterns because of diffusion of the polymeric PAG and part of the second material next to this layer due to the inherent aqueous base solubility of this material. Examples of polymers having a controlled dissolution rate in aqueous base developer are novolaks resins as are employed in diazonaphthaquinone based positive tone 365 nm and 436 nm photoresists.

The novel polymeric thermal acid generator composition may also be used to achieve Lithographic Image Reversal (LIR) as shown FIG. 4. In this approach, first a photoresist pattern is generated using a conventional lithographic technique such as photolithography with a positive chemically amplified photoresist material comprising a polymer with acid labile groups protecting base soluble moieties, and a photoacid generator. Then the novel polymeric thermal acid generator aqueous composition is coated over the photoresist pattern followed by a PAB to activate the novel thermal acid generator. The PAB temperature and time are chosen to be high enough (such as 130° C.-180° C.) and long enough (such as 30-120 seconds) respectively such that the activated acid generator will diffuse into and deprotect the acid labile groups of the photoresist patterns coated with the polymeric thermal acid generator.

After water development to remove excess thermal acid generator coating, a second material is overcoated in a process such that only trenches are filled without leaving any second material on the top of pattern. This second material comprises a spin casting solvent which does not destroy the underlying pattern with deprotected acid labile groups. Suitable spin casting solvent(s) may be chosen from the group consisting of $C_4$-$C_8$ alkyl acetates, $C_8$-$C_{12}$ alkanes, $C_4$-$C_8$ alcohols, and mixtures of these which are miscible. After development with an aqueous alkali developer, such as TMAH, the original photoresist pattern is developed away leaving behind the pattern formed by the second coating material. Thus the original lines become trenches while original trenches become lines. In this case, the second material may be any polymers that are insoluble in aqueous base developer but soluble in the suitable spin casting solvent described above. If the second material does cover the top of the original lines, a dry etch back can be performed or chemical mechanical polishing can be employed to remove it before aqueous base development. The second material may be a polymer comprising acid labile groups. If the second material is a polymer comprising acid labile groups and the original photoresist lines are covered by this material, wet etch can be used to remove the material on top of the lines. One such wet etch back may be just by overcoating another layer of the novel polymeric thermal acid generator composition and applying PAB and aqueous base development.

The present invention relates to a coating composition for photoresist features, comprising at least one water soluble polymer bound thermal acid generator. More than one polymer bound thermal acid generator or a polymer containing more than one thermal acid generator may be used in the present novel composition.

In processes where the second coating composition is a polymer containing acid labile groups, any polymers being used in positive chemically amplified photoresists may be used. As an example, such compositions and polymers are described in US 2009/0081589 A1. The polymer containing an acid labile group masking and acid labile moiety (PAL) may be selected from the following;

(1) a reaction product formed in the absence of a catalyst between (i) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (ii) a compound selected from a vinyl ether and an unsubstituted or substituted heteroalicyclic;

(2) a reaction product formed in the absence of a catalyst between (i) a novolak polymer, (ii) a polyhydroxy compound having 2 to 7 phenolic groups, and (iii) a compound selected from a vinyl ether and an unsubstituted or substituted heteroalicyclic;

(3) a reaction product formed in the absence of a catalyst between (i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a vinyl ether and an unsubstituted or substituted heteroalicyclic;

(4) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic and (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking; and (5) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a novolak.

Suitable spin casting solvents employed to coat the PAL composition onto the treated first photoresist pattern, which has been subjected to a coating process with the polymeric thermal acid generator and a PAB, must not dissolve this treated first photoresist pattern. Suitable spin casting solvent may be chosen from the group consisting of $C_4$-$C_8$ alkyl acetate, $C_8$-$C_{12}$ alkanes, $C_4$-$C_8$ alcohols, and mixtures of these which are miscible. Specific examples of suitable solvents are butyl acetate, propyl acetate, pentyl acetate, 4-methyl-2-pentanol, pentanol, and hexanol.

In addition to the above described materials, commercially available positive chemically amplified resist resins may also be used as PAL materials. These may be independently chosen from the same group, as subsequently described, as appropriate choices for forming the initial resist pattern such as ones designed for i-line, g-line, 248 nm, 193 nm, 157 nm, EUV or for e-beam or other energetic beam exposure.

The film thickness of the second coating comprising polymer containing acid labile groups (PAL) or alternatively that of a positive chemically amplified photoresist can range from 50 to 2000 nm.

The capped photoresist pattern coated with the polymer containing acid labile groups masking aqueous base soluble moieties (PAL) dissolved in a spin casting which does not dissolve the first resist pattern, as previously described, is subjected to a PAB, thereby causing a reaction of the coating material with the capped photoresist pattern. This is then developed with an aqueous base developer such as TMAH resulting in double patterning.

Double patterned features created as described above by using the polymeric thermal acid generator composition can further be enhanced by trimming process described above using the same polymeric thermal acid generator composition.

Double patterned features created as described above by using the polymeric thermal acid generator composition may further be enhanced by other processes such as metal sputtering/lift-off.

The positive chemically amplified photoresist used to form the first lithographic pattern may be of any type designed for 436 nm, 365 nm, 248 nm, 193 nm, 157 nm, EUV or for e-beam or other energetic beam exposure.

Specifically, to form positive patterns from chemically amplified photoresist, to date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art and the pattern resulting from these may also be employed. Patterns resulting from exposure of positive chemically amplified e-beam lithographic resists may also be employed.

Specific examples of positive 193 nm chemically amplified resist are AZ® AX3110p, and AZ® AX2110p available through AZ® Electronic Materials, Somerville, N.J.

In another embodiment, a pattern with enhanced resolution and/or double patterned features are first generated using the novel polymeric polymeric thermal acid generator composition as previously described, and, in turn, this pattern is then used as a guiding pattern in a graphoepitaxy or chemoepitaxy directed self assembly (DSA) process to further enhance resolution, as described in more detail below.

The process comprises forming a neutral layer over a substrate; forming a plurality of first mask patterns using a first photoresist on a substrate coated with a neutral layer; forming a capping film by applying the novel composition comprising the polymeric thermal acid generator, baking to activate and diffuse the polymeric thermal acid generator into the first photoresist patterns, followed by removing unreacted polymeric thermal acid generator with a removing solution; forming a second mask layer on the capping films so as to fill the first patterns by spin coating with a second composition. The second composition may be a polymer that is insoluble in an aqueous alkali developer (e.g. TMAH) dissolved in a spin casting which does not dissolve the first resist pattern, as previously described. The second composition may be coated in such a way that only trenches in the first photoresist are filled without leaving any second material on top of the lines in the first photoresist. After baking, aqueous base developer may be applied to develop away the deprotected thin layer around the first photoresist patterns resulting in double patterning. If the second composition does cover the top of lines in the first photoresist patterns, plasma etch back or chemical mechanical polishing may be used to remove the top layer before TMAH development.

The second composition applied is a suitable spin casting solvent may also be a polymer that has controllable dissolution rate in an aqueous alkali developer, such as TMAH. In this case, aqueous development may be directly applied to remove top layer that covers both line and trenches area. The deprotected thin layer around the first photoresist patterns are also removed, resulting in double patterned features.

The second masking composition applied dissolved in a spin casting which does not dissolve the first resist pattern, as previously described, over the capped first photoresist patterns may further be polymers containing acid labile groups. Upon baking, the polymeric thermal acid generator in the first photoresist patterns will diffuse into and deprotect the neighboring area of the second masking layer. An aqueous alkali developer, such as TMAH will remove both deprotected first photoresist and an adjoining thin layer of deprotected second masking material, resulting in double patterned features. Before aqueous base development, a dry plasma etch back or wet etch back may be required if the second mask layer covers both line and trenches areas in the first photoresist patterns.

After double patterned features are created using the above mentioned processes, a trimming process may be further applied to enhance CD using above mentioned novel polymeric thermal acid generator composition as described in FIG. 2.

Double patterned features generated over the neutral layer-coated substrate by the above described process may be directly used as guiding patterns for directed self-assembly of block copolymers.

Double patterned features generated over the neutral layer-coated substrate by the above described process may further be enhanced by subsequent processes before applying directed self-assembly of block copolymers.

In another process enabled by this invention, double patterned features over a neutral layer-coated substrate may be made by using the polymeric thermal acid generator of structure (2) or its subsequently described copolymers. Narrow trenches in double patterned features are then filled with a hard mask material. Subsequent selective plasma etch will generate narrow lines with wide trenches over a neutral surface. Such patterns will be used to direct self-assembly of block copolymers to achieve dense lines. The process comprises the steps of a) forming a neutral layer on a substrate; b) forming by photolithography a plurality of first photoresist patterns on a neutral layer coated substrate; c) forming a first capping film by applying a polymeric thermal acid generator from an aqueous solution and baking, followed by an aqueous rinse to remove polymeric thermal acid generator of structure (2) or its subsequently described copolymers material; d) forming a second mask layer on the capping films with a composition comprising a polymer containing acid labile groups; e) forming a plurality of acid diffused regions extending from both the first and second capping films into the second mask layer by heating the film and diffusing the acid obtained from the polymeric thermal acid generator capping films into the second mask layer; f) overcoating the polymeric thermal acid generator composition again and baking; g) forming double patterned features by using and aqueous base developer (e.g. TMAH) to remove both the top layer and the deprotected area between the first photoresist and the second capping layer; h) depositing and/or spin coating a hard mask layer; i) removing the top hard mask layer covering the lines by dry plasma etch and/or suitable wet etch; j) forming narrow line hard mask patterns by removing original lines in the double patterned features by dissolving in solvents; k) applying block copolymers to form a coating; l) annealing the block copolymer thermally so as to allow it to undergo directed self assembly using the capped features generated in (j) to guide the self assembly process.

Hard mask materials appropriate for the above described process may be chosen from the group consisting perhydroxy polysilazane, alkyl or aryl polysilazane polymer or copolymers, SiN, SiO$_2$, TiO$_2$, SiC, SiN, SiON or other materials which are silicon rich or rich in other refractory elements resistant to plasma etching. These hard masks can be deposited by any suitable method, including, for example, chemical vapor deposition, sputter deposition or by the use of spinable materials such as the non-limiting examples of polysilazanes, silsesquioxane, spin on glasses and the like.

As a variant of the above described process, step (i) can be omitted and instead the removal of the original lines in double patterned features may be realized by a lift-off process.

The substrate appropriate for the above described process may be chosen from the group comprising silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group IIIN compounds.

The block copolymer appropriate for the above described process may be chosen from the group consisting materials comprised of a block of monomeric units with high etch rate and a block of monomeric units with low etch rate in oxygen based plasmas.

Any suitable neutral layer composition may be used. One such composition is a neutral layer composition which when formed into a layer remain neutral to the self assembly block copolymer and is not damaged by processing steps of directed self assembly techniques, and can further enhance the lithographic performance of the directed self assembly materials and processes, especially reducing the number of processing steps and providing better pattern resolution with good lithographic performance for instance as described in U.S. patent application Ser. No. 13/243,640 filed Sep. 23, 2011 and incorporated herein by reference which is comprised of a random copolymer consisting of at least one unit of structure (4), at least one unit of structure (5) and at least one unit of structure (6)

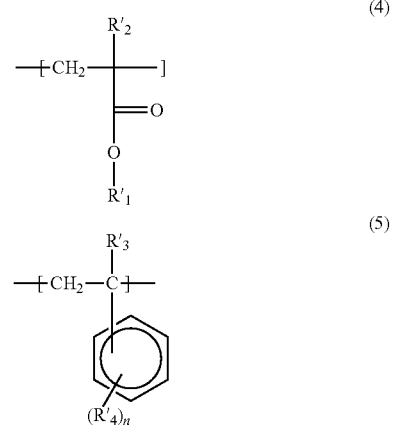

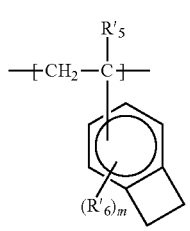

(6)

where R'$_1$ is selected from the group consisting of C$_1$-C$_8$ alkyl, C$_1$-C$_8$ fluoroalkyl, C$_1$-C$_8$ partially fluorinated alkyl, C$_4$-C$_8$ cycloalkyl moiety, C$_4$-C$_8$ cyclofluoroalkyl moiety, C$_4$-C$_8$ partially fluorinated cycloalkyl moiety, and C$_2$-C$_8$ hydroxyalkyl; R'$_2$, R'$_3$ and R'$_5$ are independently selected from a group consisting of H, C$_1$-C$_4$ alkyl, CF$_3$ and F; R'$_4$ is selected from the group consisting of H, C$_1$-C$_8$ alkyl, C$_1$-C$_8$ partially fluorinated alkyl and C$_1$-C$_8$ fluoroalkyl, n ranges from 1 to 5, R'$_6$ is selected from the group consisting of H, F, C$_1$-C$_8$ alkyl and a C$_1$-C$_8$ fluoroalkyl and m ranges from 1 to 3.

The neutral layer composition is coated on a substrate and heated to remove the solvent and crosslink the film. Typical film thickness range from about 3 nm to about 50 nm after heating, or about 3 nm to about 30 nm, or about 4 nm to about 20 nm, or about 5 nm to about 20 nm, or about 10 nm to about 20 nm. The film can be heated at temperatures ranging from about 180° C. to about 350° C., or from about 200° C. to about 300° C. Once the crosslinked film has been formed the coating may be used for further processing to finally form a pattern using any self directed assembly techniques. Examples of such techniques are graphoepitaxy, standard chemoepitaxy, chemoepitaxy with pinning, etc. The crosslinked neutral layers formed by the novel neutral layer composition remain neutral despite any damage that might occur during the lithographic processes where the crosslinked neutral layer is used, such as dissolution from organic solvents (such as solvents used to form coatings above the neutral layer, solvent developers, etc), dissolution in aqueous alkaline developers, damage from processes used to image the photoresist coated over the neutral layer (such as e-beam, euv, deep uv, etc), or dissolution in photoresist strippers. The crosslinked layers are not soluble in solvents such as those that are used to coat the photoresist, such as PGMEA, PGME, Ethyl Lactate, etc.

The block copolymer for use in directed self assembly in conjunction with the neutral layer composition can be any block copolymers which can form domains through self assembly. The microdomains are formed by blocks of the same type which tend to self associate. Typically, block copolymer employed for this purpose are polymers in which the repeat units derived from monomers are arranged in blocks which are different compositionally, structurally or both and are capable of phase separating and forming domains. The blocks have differing properties which can be used to remove one block while keeping the other block intact on the surface, thus providing a pattern on the surface. Thus, the block may be selectively removed by plasma etching, solvent etching, developer etching using aqueous alkaline solution, etc. In block copolymers based on organic monomers, one block can be made from polyolefinic monomers including polydienes, polyethers including poly(alkylene oxides) such as polyethylene oxide), poly(propylene oxide), polybutylene oxide) or mixtures thereof; and, the other block can be made from different monomers including poly((meth) acrylates), polystyrenes, polyesters, polyorganosiloxanes, polyorganogermanes, and or mixtures thereof. These blocks in a polymer chain can each comprise one or more repeat units derived from monomers. Depending on the type of pattern needed and methods used different types of block copolymers may be used. For instance, these may consist of diblock copolymers, triblock copolymers, terpolymers, or multiblock copolymers. The blocks of these block copolymers may themselves consist of homopolymers or copolymers. Block copolymers of different types may also be employed for self assembly, such as dendritic block copolymers, hyperbranched block copolymers, graft block copolymers, organic diblock copolymers, organoic multiblock copolymers, linear block copolymers, star block copolymers amphiphilic inorganic block copolymers, amphiphilic organic block copolymers or a mixture consisting of at least block copolymers of different types.

The blocks of organic block copolymer may comprise repeat units derived from monomers such as C$_{2-30}$ olefins, (meth)acrylate monomers derived from C$_{1-30}$ alcohols, inorganic-containing monomers including those based on Si, Ge, Ti, Fe, Al. Monomers based on C$_{2-30}$ olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth) acrylate monomers such as (meth)acrylate, methyl (meth) acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth) acrylate, neopentyl (meth)acrylate, n-hexyl (meth)acrylate, cyclohexyl (meth)acrylate, isobornyl (meth)acrylate, hydroxyethyl (meth)acrylate or mixtures thereof.

An illustrative example of a block copolymer containing one type of high etch resistant repeat unit would be a polystyrene block containing only repeat units derived from styrene and another type of highly etchable polymethylmethacrylate block containing only repeat units derived from methylmethacrylate. These together would form the block copolymer poly(styrene-b-methylmethacrylate), where b refers to block.

Specific non-limiting examples of block copolymers that are useful for graphoepitaxy, chemoepitaxy or pinned chemoepitaxy as used for directed self assembly on a patterned neutral layer, are poly(styrene-b-vinyl pyridine), poly (styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the directed self assembled polymer to pattern transfer onto the substrate to affect either pattern rectification or pattern multiplication.

Typically, the block copolymers employed for the directed self assembly such as in graphoepitaxy, chemoepitaxy or pinned chemoepitaxy have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) of about 1.01 to about 6, or 1.01 to about 2 or 1.01 to about 1.5. Molecular weight, both $M_w$ and $M_n$, can be determined by, for example, gel permeation chromatography using a universal calibration method, calibrated to polystyrene standards. This ensures that the polymer blocks have enough mobility to undergo self assembly when applied to a given surface either spontaneously, or by using a purely thermal treatment, or through a thermal process which is assisted by the absorption of solvent vapor into the polymer framework to increase flow of segments enabling self assembly to occur.

Solvents suitable for dissolving block copolymers for forming a film can vary with the solubility requirements of the block copolymer. Examples of solvents for the block copolymer assembly include propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. In an embodiment, specifically useful casting solvents include propylene glycol monomethyl ether acetate (PGMEA), gamma-butyrolactone (GBL), or a combination of these solvents.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The materials described in the above process can be chosen as was previously described for the lift off process.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular weight of the polymeric thermal acid generators (Synthesis Example 2) and its precursor polymer (Synthesis Example 1) were measured on a Gel Permeation using a Water 2695 Alliance Separation Module, or equivalent equipped with a Waters Dual Wavelength UV Detector, Model 2487, or equivalent and a Waters Differential Refractometer, Model 2414, Detector equivalent. The molecular weight of the polymer of Synthetic Example 3 was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Detector equivalent. Solubility measurements of polymers in PGMEA and Thermogravimetric analysis measurement were made as described in the Examples. "

All chemicals unless otherwise noted were obtained from the Sigma-Aldrich Co.

Synthesis Example 1 (Amino-Containing Polymer)

Synthesis of Poly(N,N-dimethylaminoethylacrylate-co-N-vinylpyrrolidone)

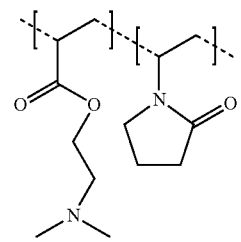

A mixture of N,N-dimethylaminoethylacrylate (DMAEA) (25.70 g, 0.1795 mol), N-vinylpyrrolidone (NVP)) (19.95 g, 0.1795 mol), 6.85 g of initiator, Azo-bisisobutyronitrile (AIBN) and 97.50 g of acetonitrile were added to a 500 ml round bottom flask equipped with a water condenser and a nitrogen inlet. The initiator concentration was 15 wt % relative to the total weight of the monomers. Other solvents such as isopropylalcohol (IPA), 2-butanone and methanol can also be used instead of acetonitrile. Nitrogen gas was purged into the solution for 30 minutes at room temperature with stirring. After the nitrogen purge, the reaction solution was heated to 65° C. The polymerization reaction was carried out for 6 hours. After the completion of polymerization, the polymer solution was cooled to 30° C. and concentrated using rotary evaporator. The concentrated solution was precipitated in diethyl ether. Other solvents such as diisopropyl ether and tert-butylmethyl ether may also be used. The amount of precipitating solvent used was 7 times that of the initial volume of reaction. The final copolymer was vacuum dried at 40° C. and the yield was 70%. The copolymer was characterized by NMR, GPC. The weight average molecular weight of the polymer was 24,832 (Mw) and polydispersity was 4.0.

Synthesis Example 2 (Sulfonic Acid-Neutralized Amino Polymer)

Synthesis of Poly(N,N-dimethylaminoethylacrylate-co-N-vinylpyrrolidone) para-toluenesulfonic acid salt as isolated material 123.6 g of poly(N,N-dimethylaminoethylacrylate-co-N-vinylpyrrolidone) made in as in Example 1 was dissolved in 428 g of acetonitrile under stirring. 117 g of p-toluenesulfonic acid monohydrate (PTSA) was dissolved in about 720 g of acetonitrile and filtered to obtain a clear solution. The PTSA solution was added slowly into the polymer solution under stirring. After addition, the solution was stirred at room temperature for 18 hrs. The reaction mixture was then diluted with about 50 g of methanol and filtered through filter paper. The solution was concentrated to about 1.5 liter using a rotary evaporator at 40° C. Under stirring, about 4 liters of diethyl ether was slowly added into this polymer solution to obtain a white polymer gum. The polymer was washed twice with fresh diethyl ether with agitation. The polymer was further purified by redissolving in about 1 liter of methanol and precipitating in diethyl ether following the same procedure described above. Finally the polymer was dried in a 50° C. vacuum oven until constant weight. About 165 g of polymer was obtained.

The weight average molecular weight of the polymer was 44587 (Mw) and polydispersity was 8.5. C-13 NMR was also used to characterize the polymer which confirmed the presence of the expected carbons in the final product as assigned in structure 7: carbon 17 (142.8 ppm); carbon 16 (140.5 ppm); carbon 15 (21.2 ppm); carbon 14 (130.1 ppm); carbon 13 (126.0 ppm); carbon 12 (178.8 ppm); carbon 11 (175.9 ppm); carbon 10 (35.0 ppm); carbon 9 (45.1 ppm); carbon 8 (43.7 ppm); carbon 7 (56.1 ppm); carbon 6 (59.8 ppm); carbon 5 (35.0 ppm); carbon 4 (45.5 ppm); carbon 3 (31.9 ppm); carbon 2 (18.2 pm); carbon 1 (45.8 ppm).

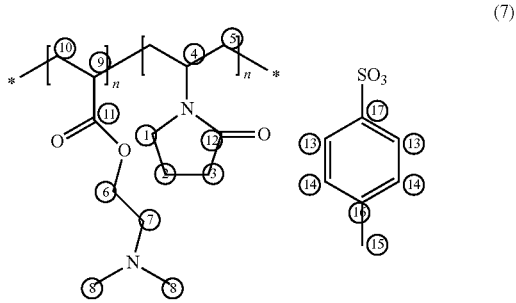

(7)

Synthesis Example 3

Acid Labile Groups-Containing Polymer

A reaction mixture consisting of 1821.6 gm CZ-6 polymer (Dupont Chemical Co.) solution (41.32% solids in PGMEA) combined with 1073.5 gm SPN 560 novolak (CYTEC Chemical Co.) (47.3% solids in PGMEA) was placed in a 5 neck 5 liter flask equipped with good agitation, heating mantel, thermometer, temperature control, a condenser and a pressure gauge monitor, was heated up slowly from room temperature to 120° C. in two hours with good agitation. Upon reacting at 120° C., 114 gm of ethyl vinyl ether (EVE), dissolved in 100 gm PGMEA, was slowly added to the stirred reaction mixture while monitoring pressure build up in the reactor adjusting the addition rate so as to avoid excessive pressure build up (i.e. does not exceed 5 lb/in$^2$.) After the addition was complete, the stirred reaction mixture was kept at 120° C. for three more hours. After this time, residual EVE along with some solvent was distilled off and the reaction mixture was allowed to cool down to room temperature. The final solids content of the reaction solution was ~45.6 wt %. The PAL polymer was characterized by the change in dissolution rate as follows: The initial dissolution rates of the SPN-560 novolak selected to be above 1,000 Å/S (1,200-1, 650) while the dissolution rate of CZ-6 (DuPont copolymer 6 HS/4 t-BA) is ~27-30 Å/S, giving a dissolution rate before reaction for this blend of 600-200 Å/S. After reaction the blend functionalized by EVE has a dissolution rate below 2 Å/S (typically ~1.3)

Lithographic Example 1

Line Capping Followed by Line Trimming

Poly(N,N-dimethylaminoethylacrylate-co-N-vinylpyrrolidone) tosic acid salt as described in "Synthesis example 2." (4 grams) and 0.0005 grams of the surfactant (Pionion SF-485) were dissolved in 96 grams of de-ionized water. The formulation was mixed for 12 hours to form a homogeneous solution and filtered with a 0.2 micron PTFE filter.

An antireflective coating, AZ® ArF-1C5D, was spin-coated on a bare silicon wafer followed by a bake at 200° C. for 60 seconds to form a film of 37 nm thickness. Photoresist AZ® AX2110P was spin-coated on the stack and baked at 110° C. for 60 seconds so as to obtain a 120 nm film. This film stack was then exposed with a 193 nm Nikon 306D scanner. A post exposure bake at 110° C. for 60 seconds was applied. The wafer was then developed with AZ® MIF300 (available from AZ electronic Materials, Somerville, N.J.) for 30 seconds to produce 80 nm line/space features.

These lithographic features were then spin coated with the above-prepared solution of Poly(N,N-dimethylaminoethylacrylate-co-N-vinylpyrrolidone) tosic acid salt, baked at 120° C. for 60 min to form an overcoat of 50 nm. The wafer was then developed with AZ MIF300 for 30 seconds. After this development, the line width was reduced to 72 nm.

Lithographic Example 2

LIR Process

Poly(N,N-dimethylaminoethylacrylate-co-N-vinylpyrrolidone) tosic acid salt as described in "Synthesis example 2." (4 grams) and 0.0005 grams of the surfactant (Pionion SF-485) were dissolved in 96 grams of de-ionized water. The formulation was mixed for 12 hours to form a homogeneous solution and filtered with a 0.2 micron PTFE filter.

A bottom anti-reflective coating material (B.A.R.C), AZ® ArF-1C5D (manufactured by AZ® EM USA Corp, 70 Meister Ave., Somerville, N.J.) was spin coated on a silicon substrate and baked at 200° C. for 60 seconds to prepare an antireflective coating layer of 37 nm in thickness. Then, AZ® AX3110P photoresist solution (manufactured by AZEM USA Corps, 70, Meister Ave., Somerville, N.J.) was spin-coated on the bottom anti-reflective coated (B.A.R.C) silicon substrate. The photoresist film was then baked at 100° C. for 60 seconds to give a film thickness of 120 nm. After exposure at 193 nm, the wafer was post-exposure baked at 110° C. for 60 seconds and developed using AZ®626 MIF Developer (manufactured by AZEM USA Corps, 70, Meister Ave., Somerville, N.J.), for 30 seconds, to form isolated 40-52 nm lines.

The resultant photoresist patterns were then over-coated with the above-prepared solution of Poly(N,N-dimethylaminoethylacrylate-co-N-vinylpyrrolidone) tosic acid salt, baked at 130° C. for 60 seconds, rinsed with DI water 30 seconds.

A 3.6 wt % of the polymer of Synthesis Example 3 was prepared by dissolving the polymer in 4-methyl-2-pentanol and filtered with a 0.2 micron PTFE filter. This solution was spin-cast on above lithographic features to give a 80 nm thick film, soft baking at 100° C. for 60 seconds to remove solvents in the coated film, followed by 120° C. baking for 60 seconds.

1.32 g of Pyridinium p-toluenesulfonate was dissolved in a 298.7 g of 4.2 wt % polyvinyl alcohol aqueous solution and filtered with a 0.2 micron Nylon filter. This solution was spin cast on the above wafer to form a 90 nm film which was baked at 120° C. for 60 seconds. Finally the wafer was developed using 2.38 wt % TMAH Developer for 45 seconds to give image reversed narrow trenches of 24-32 nm.

Lithographic Example 3

Double Patterning Process Using Polymer Thermal Acid Generator Composition

Step 1 First Photoresist Pattern

The resist AZ® SZF-153 was coated as 1.05 µm thick film on 6 inch Si wafer previously coated with a 10 nm AZ® Experimental NLD-175 neutral layer. This film was then soft baked at 110° C./90 sec, exposed with an 365 nm stepper at 50 mJ/cm$^2$, post exposure baked at 110° C./120 sec, and finally developed with 2.38 wt % tetramethylammonium hydroxide (TMAH) solution for 60 seconds to produce 841 nm/908 nm L/S features.

Step 2 Treatment with Polymeric TAG of "Synthetic Example 2."

A 10 wt % solution of polymer made in synthesis example 2 was prepared by dissolving the polymer in water. Surfactant SF-485 was added to make the surfactant content 500 ppm. This solution was coated on the lithographic pattern produced in step 1 at 300 rpm/30 sec and baked at 130° C./180 sec, and rinsed with for 60 sec with distilled water to produce lithographic features treated by the action of the polymeric TAG.

Step 3 Treatment with Acid Labile Groups-Containing Polymer

A 9 wt % solution of the polymer made in Synthesis example 3 was prepared by dissolving the polymer in PGMEA and was coated at 2000 rpm/2 min on the encapsulated features produced in Step 2 and baked (100° C./90 sec).

Step 4 Second Treatment with Polymeric Thermal Acid Generator

A 5 wt % solution of polymer made in synthesis example 2 was prepared by dissolving the polymer in water. Surfactant SF-485 was added to make the surfactant content 500 ppm. This solution was coated on the patterned wafer produced in step 3 at 300 rpm/30 sec, and then the film was baked at 120° C./180 sec, and finally developed with 2.38 wt % TMAH. This produced lithographic features in which the overlying PAL polymer has been removed from the top of the film and a narrow trench had also been created between the original pattern and the remaining acid labile group-containing polymer film between the original lithographic patterns, resulting in double patterned features.

Comparative Synthesis Example 1

Synthesis of Poly(N,N-dimethylaminoethylacrylate-co-N-vinylpyrrolidone) para toluene sulfonate salt prepared in water solution but not isolated Step 1:

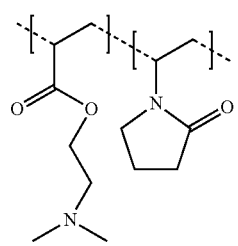

A mixture of N,N-dimethylaminoethylacrylate (DMAEA) (25.70 g, 0.1795 mol), N-vinylpyrrolidone (NVP)) (19.95 g, 0.1795 mol), 6.85 g of initiator, Azo-bisisobutyronitrile (AIBN) and 97.50 g of acetonitrile were added to a 500 ml round bottom flask equipped with water condenser and nitrogen inlet. The initiator concentration was 15 wt % relative to the total weight of the monomers. Other solvents such as isopropylalcohol (IPA), 2-butanone and methanol can also be used instead of acetonitrile. Nitrogen gas was purged into the solution for 30 minutes at room temperature with stirring. After the nitrogen purge, the reaction solution was heated to 65° C. The polymerization reaction was carried out for 6 hours. After the completion of polymerization, the polymer solution was cooled to 30° C. and concentrated using rotary evaporator to remove solvent and unreacted monomer. 10 wt % solution of Poly(N,N-dimethylaminoethylacrylate-co-N-vinylpyrrolidone) prepared in DI water. pH was measured using Metrohm 716 DMS Titrino (Brinkman Instruments, Inc.). Initial pH of the poly(DMAEA-co-NVP) was 11.

Step 2:

A 5 wt % solution of para-toluenesulfonic acid (pTSA) in DI water was added slowly to the 10 wt % solution of Poly (N,N-dimethylaminoethylacrylate-co-N-vinylpyrrolidone) prepared in step 1 with constant stirring till to get pH 7.0 (100 mole % added p-TSA). Acidic polymer solutions, pH 5 and pH2 were also prepared for testing in a similar fashion by adding slowly adding more of the 5% solution of para-toluenesulfonic acid p-TSA until the targeted pH is achieved. pH 5 and pH 2 were achieved by adding 150 mole % and 200 mole % p-TSA respectively.

Characterization data for polymer solution with pH of 7.0

$^{13}$C NMR (CD$_3$OD) data: δ 176.5 ppm (>C═O, NVP); δ 175.0 ppm (>C═O, DMAEA); δ62.2 ppm (O—CH$_2$, DMAEA); δ57.6 ppm (>N—CH$_2$, DMAEA); δ 45.3 ppm (—N—CH$_3$, DMAEA); δ 45.2 ppm (—N—CH$_2$, NVP); δ 42.0-34.0 ppm (main chain —CH, CH$_2$ of NVP & DMAEA, overlapped); δ 32.2 ppm (O═C—CH$_2$, NVP); δ19.0 ppm (—N—CH$_2$—CH$_2$—, NVP), δ 125.8-129.7 ppm (—CH of phenyl), δ 140-142.5 ppm (quaternary carbon of pTSA) and δ 20.4 (—CH$_3$ of pTSA).

When the solution of Poly(N,N-dimethylaminoethylacrylate-co-N-vinylpyrrolidone) para toluene sulfonate salt was neutralized in solution with 150 mole % or 200 mole % p-TSA the solutions were not stable and became cloudy on standing. The corresponding solution with pH 7 in which 100 mole % p-TSA had been added was however stable. Consequently, only the 10 wt % polymer solution with pH of 7.0 in which 100 mole % of p-TSA had been added was employed in "Comparative lithographic example 1

The solution with pH 7.0 prepared in "Comparative Synthesis Example 1" in which 100 mole % of p-TSA had been added was employed and 500 ppm of the surfactant Pionion SF-485 was added and the solution was filtered through a 0.2 micron PFTE filter.

Comparative Lithographic Example 1

LIR Process

Poly(N,N-dimethylaminoethylacrylate-co-N-vinylpyrrolidone) tosic acid salt as described in Comparative Synthesis example 1 was diluted by water to give a 4 wt % solution and surfactant (Pionion SF-485) was added to make 500 ppm and the solution and filtered with a 0.2 micron PTFE filter.

A bottom anti-reflective coating material (B.A.R.C), AZ® ArF-1C5D (manufactured by AZ® EM USA Corp, 70 Meister Ave., Somerville, N.J.) was spin coated on a silicon substrate and baked at 200° C. for 60 seconds to prepare an antireflective coating layer of 37 nm in thickness. Then, AZ® AX3110P photoresist solution (manufactured by AZEM USA Corps, 70, Meister Ave., Somerville, N.J.) was spin-coated on the bottom anti-reflective coated (B.A.R.C) silicon substrate. The photoresist film was then baked at 100° C. for 60 seconds to give a film thickness of 120 nm. After exposure at 193 nm, the wafer was post-exposure baked at 110° C. for 60 seconds and developed using AZ®626 MIF Developer (manufactured by AZEM USA Corps, 70, Meister Ave., Somerville, N.J.), for 30 seconds, to form isolated 40-52 nm lines.

The resultant photoresist patterns were then over-coated with the above-prepared solution of poly(N,N-dimethylaminoethylacrylate-co-N-vinylpyrrolidone) tosic acid salt, baked at 130° C. for 60 seconds, rinsed with DI water 30 seconds.

A 3.6 wt % of the polymer of Synthesis Example 3 was prepared by dissolving the polymer in 4-methyl-2-pentanol and filtered with a 0.2 micron PTFE filter. This solution was spin-cast on above lithographic features to give a 80 nm thick film, soft baking at 100° C. for 60 seconds to remove solvents in the coated film, followed by 120° C. baking for 60 seconds.

1.32 g of Pyridinium p-toluenesulfonate was dissolved in a 298.7 g of 4.2 wt % polyvinyl alcohol aqueous solution and filtered with a 0.2 micron Nylon filter. This solution was spin cast on the above wafer to form a 90 nm film which was baked at 120° C. for 60 seconds. Finally the wafer was developed using 2.38 wt % TMAH Developer for 45 seconds. All solutions of poly(N,N-dimethylaminoethylacrylate-co-N-vinylpyrrolidone) tosic acid salt with various pH gave very poor litho image reversal with loss of adhesion of features. As a comparison, the isolated polymer prepared as described in synthesis example 2 gave very good LIR without any indication of the adhesion loss of features (see Lithographic Example 1: LIR process).

The invention claimed is:

1. An aqueous coating solution of a polymeric thermal acid generator capable of forming a layer over a photoresist pattern, where the aqueous coating solution comprises a polymer having at least one repeating unit of structure 2

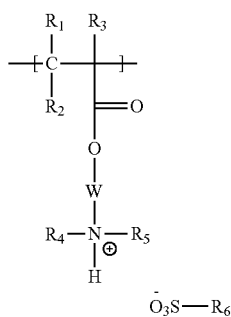

(2)

where $R_1$ to $R_5$ are independently chosen from the group consisting of H and $C_1$-$C_6$ alkyl; Re is chosen from the group consisting of aryl, substituted aryl, alkyl ($C_1$-$C_8$) and fluoroalkyl ($C_1$-$C_8$) and W is a $C_2$-$C_6$ alkylene spacer group and further where the polymer further comprises a repeating unit of structure 3,

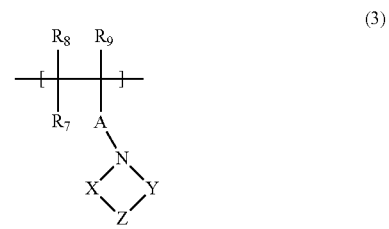

(3)

where, $R_7$ to $R_9$ are independently selected from hydrogen and $C_1$ to $C_6$ alkyl, A is selected from a single bond, O, C(O), (C=O)O, $C_1$ to $C_4$ alkylene; X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from oxygen, C(O) and nitrogen and further where the aqueous coating solution is free of a crosslinking compound and further where the polymer has a molecular weight range of 5,000 to 200,000 g/mol.

2. The aqueous coating solution of claim 1, where the polymer is an isolated reaction product of a polymer comprising at least one repeating unit of structure 1 and further comprising a repeating unit of structure 3, and a sulfonic acid,

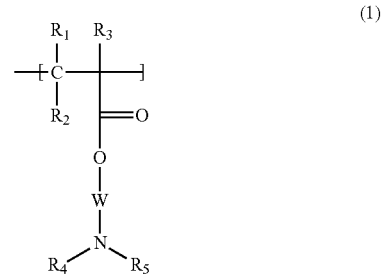

(1)

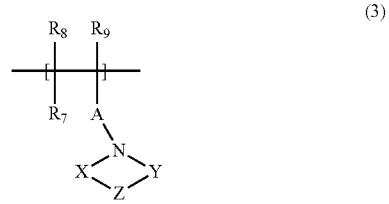

(3)

where $R_1$ to $R_5$ are independently chosen from the group consisting of H and $C_1$-$C_6$ alkyl, and W is a $C_2$-$C_6$ alkylene spacer group and further where, $R_7$ to $R_9$ are independently selected from hydrogen and $C_1$ to $C_6$ alkyl, A is selected from a single bond, O, C(O), (C=O)O, $C_1$ to $C_4$ alkylene; X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from oxygen, C(O) and nitrogen.

3. The coating solution of claim 1, where the repeating unit of structure 3 is selected from,

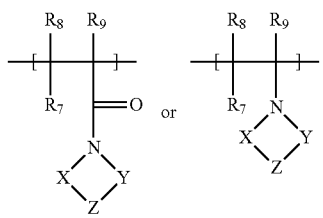

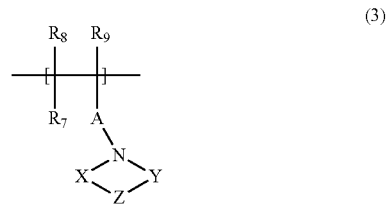

where, $R_7$ to $R_9$ are independently selected from hydrogen and $C_1$ to $C_6$ alkyl, X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from oxygen, C(O) and nitrogen.

4. The coating solution of claim 1, where the repeating unit of structure 3 is selected from,

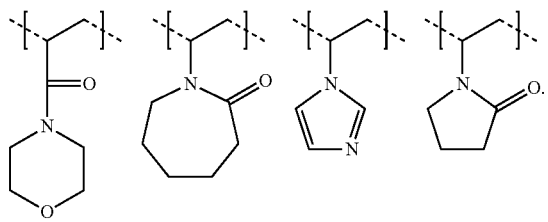

5. The coating solution of claim 1, where W is selected from methylene and ethylene.

6. The coating solution of claim 1, where the composition further contains a water miscible solvent.

7. The coating solution of claim 1, where the composition further comprises additives selected from surfactant, and $C_1$-$C_8$ alcohol.

8. A process for manufacturing a microelectronic device, comprising;
a) providing a substrate with a photoresist pattern;
b) coating the photoresist pattern with an aqueous coating solution of a polymeric thermal acid generator capable of forming a layer over a photoresist pattern, where the aqueous coating composition comprises a polymer having at least one repeating unit of structure 2;

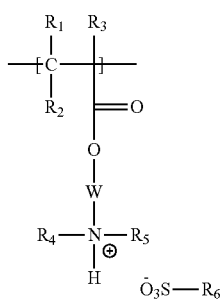

where $R_1$ to $R_5$ are independently chosen from the group consisting of H and $C_1$-$C_6$ alkyl; Re is chosen from the group consisting of aryl, substituted aryl, alkyl ($C_1$-$C_8$) and fluoroalkyl ($C_1$-$C_8$) and W is a $C_2$-$C_6$ alkylene spacer group and further where the polymer further comprises a repeating unit of structure 3, where, $R_7$ to $R_9$ are independently selected from hydrogen and $C_1$ to $C_6$ alkyl, A is selected from a single bond, O, C(O), (C=O)O, $C_1$ to $C_4$ alkylene; X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to C6 alkylene, direct bond, and mixtures thereof, Z is selected from oxygen, C(O) and nitrogen and further where the aqueous coating solution is free of a crosslinking compound;
c) reacting a portion of the coating solution in contact with the photoresist pattern by baking; and,
d) removing a portion of the coating solution which is not reacted, with an aqueous removal solution, thereby forming a coated photoresist pattern.

9. The process of claim 8 further comprising the step;
a) developing the coated photoresist pattern with an aqueous base developer to affect trimming of the photoresist pattern.

10. The process of claim 8 further comprising the steps;
a) coating the coated photoresist pattern with a second composition comprising a polymer comprising acid labile groups protecting aqueous base solubilizing groups and a solvent which does not dissolve the coated photoresist pattern;
b) reacting the second composition comprising a polymer comprising acid labile groups protecting aqueous base soluble groups and the polymeric thermal acid generator by baking; and,
c) removing the material deprotected at the interface between the coated photoresist pattern and the second composition comprising the polymer with acid labile groups with an aqueous alkali developer.

11. The process of claim 10 where the second composition is a positive tone chemically amplified photoresist developable by aqueous alkali.

12. The process of claim 10 where the polymer comprising acid labile groups protecting aqueous base soluble groups is selected from the group consisting of
a) a reaction product formed in the absence of a catalyst between (i) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (ii) a compound selected from a vinyl ether and an unsubstituted or substituted heteroalicyclic;
b) a reaction product formed in the absence of a catalyst between (i) a novolak polymer, (ii) a polyhydroxy compound having 2 to 7 phenolic groups, and (iii) a compound selected from a vinyl ether and an unsubstituted or substituted heteroalicyclic;
c) a reaction product formed in the absence of a catalyst between (i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a vinyl ether and an unsubstituted or substituted heteroalicyclic;

d) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic and (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking; and e) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a novolak.

13. The process of claim 10 where the solvent which does not dissolve the coated photoresist pattern is chosen from the group consisting of $C_4$-$C_8$ alkyl acetate, $C_8$-$C_{12}$ alkanes, $C_4$-$C_8$ alcohols, and mixtures thereof.

14. The process of claim 10 where the solvent which does not dissolve the coated photoresist pattern is chosen from the group consisting of butyl acetate, propyl acetate, pentyl acetate, 4-methyl-2-pentanol, pentanol, and hexanol.

15. A process for manufacturing a microelectronic device, comprising;
   a) providing a substrate with a photoresist pattern;
   b) coating the photoresist pattern with an aqueous coating solution of a polymeric thermal acid generator capable of forming a layer over a photoresist pattern, where the aqueous coating composition comprises a polymer having at least one repeating unit of structure 2;

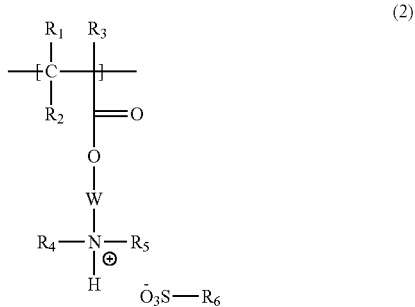

(2)

where $R_1$ to $R_5$ are independently chosen from the group consisting of H and $C_1$-$C_6$ alkyl; $R_6$ is chosen from the group consisting of aryl, substituted aryl, alkyl ($C_1$-$C_8$) and fluoroalkyl ($C_1$-$C_8$) and W is a $C_2$-$C_6$ alkylene spacer group and further where the polymer further comprises a repeating unit of structure 3,

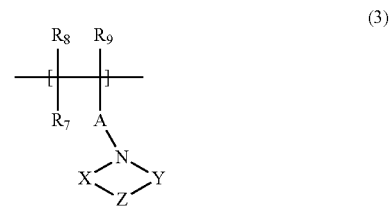

(3)

where, $R_7$ to $R_9$ are independently selected from hydrogen and $C_1$ to $C_6$ alkyl, A is selected from a single bond, O, C(O), (C=O)O, $C_1$ to $C_4$ alkylene; X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from oxygen, C(O) and nitrogen and further where the aqueous coating solution is free of a crosslinking compound;

c) reacting a portion of the coating solution in contact with the photoresist pattern by baking;

d) removing a portion of the coating solution which is not reacted with an aqueous removal solution, thereby forming a coated photoresist pattern;

e) coating the coated photoresist pattern with a second composition comprising a polymer insoluble in aqueous developer and a solvent which does not dissolve the coated photoresist pattern; and, f) developing with an aqueous base developer, thereby affecting lithographic image reversal.

16. The process of claim 15 where the second composition is a positive tone chemically amplified photoresist developable by aqueous alkali.

17. The process of claim 15 where the polymer insoluble in aqueous developer is selected from the group consisting of
   a) a reaction product formed in the absence of a catalyst between (i) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (ii) a compound selected from a vinyl ether and an unsubstituted or substituted heteroalicyclic;
   b) a reaction product formed in the absence of a catalyst between (i) a novolak polymer, (ii) a polyhydroxy compound having 2 to 7 phenolic groups, and (iii) a compound selected from a vinyl ether and an unsubstituted or substituted heteroalicyclic;
   c) a reaction product formed in the absence of a catalyst between (i) a novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a vinyl ether and an unsubstituted or substituted heteroalicyclic;
   d) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic and (ii) a polymer comprising substituted or unsubstituted hydroxystyrene and acrylate, methacrylate or a mixture of acrylate and methacrylate, the acrylate and/or methacrylate being protected by a high activation energy for deblocking; and e) a mixture of (i) a reaction product formed in the absence of a catalyst between (a) a novolak polymer, (b) a polyhydroxy compound having 2 to 7 phenolic groups, and (c) a compound selected from a vinyl ether and an unsubstituted or substituted heteroalicyclic, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a novolak.

* * * * *